United States Patent
Shimizu (10) Patent No.: US 6,380,020 B1
(45) Date of Patent: Apr. 30, 2002

(54) METHOD FOR FABRICATING A SEMICONDUCTOR DEVICE HAVING A DEVICE ISOLATION INSULATING FILM

(75) Inventor: Masakuni Shimizu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/589,729

(22) Filed: Jun. 8, 2000

(30) Foreign Application Priority Data

Jun. 8, 1999 (JP) .......................................... 11-161682

(51) Int. Cl.[7] .......................................... H01L 21/8238
(52) U.S. Cl. ...................................... 438/225; 257/501
(58) Field of Search .............................. 438/257, 275, 438/279, 241, 258, 778, 787, 453, 225; 257/501, 506, 296

(56) References Cited

U.S. PATENT DOCUMENTS

| 5,607,868 A | * | 3/1997 | Chida et al. ............. 437/34 |
| 5,663,084 A | * | 9/1997 | Yi et al. .................. 438/453 |
| 5,933,731 A | * | 8/1999 | Tanimoto et al. ........ 438/258 |
| 5,962,907 A | * | 10/1999 | Motonami ............... 257/499 |
| 6,037,222 A | * | 3/2000 | Huang et al. ............ 438/257 |
| 6,043,128 A | * | 3/2000 | Kamiya .................. 438/289 |

FOREIGN PATENT DOCUMENTS

| JP | 2-271659 | 11/1990 |
| JP | 6-196639 | 7/1994 |
| JP | 9-36243 | 2/1997 |
| JP | 11-3974 | 1/1999 |
| JP | 2000-188338 | 7/2000 |

* cited by examiner

Primary Examiner—David Nelms
Assistant Examiner—David Vu
(74) Attorney, Agent, or Firm—Hutchins, Wheeler & Dittmar

(57) ABSTRACT

For fabricating a semiconductor device having gate oxide films of different film thicknesses and a device isolation oxide film having an elevated device isolation characteristics, an oxidation-resistant film such as a nitride film is formed to cover the whole surface of a semiconductor substrate having a plurality of active regions defined by a device isolation oxide film and covered with a thin oxide film. The oxidation-resistant film and the thin oxide film are removed using, as a mask, a first resist exposing a first device formation area, and after the first resist is removed, a first gate oxide film is formed by thermally oxidizing the whole surface. The oxidation-resistant film and the thin oxide film are removed using, as a mask, a second resist exposing a second device formation area, and after the second resist is removed, a second gate oxide film is formed by thermally oxidizing the whole surface, so that the second gate oxide film is formed on an exposed surface of the substrate in the second device formation area, and the second gate oxide film is formed additionally on the first gate oxide film formed on the substrate surface in the first device formation area. Thus, the substrate surface is covered with the oxidation-resistant film just until a gate oxidation, with the result that since it is possible to prevent an unnecessary oxide film from being formed on the substrate, the etching-removal of the oxide film carried out just until the gate oxidation can be reduced, so that the thinning of the device isolation oxide film can be minimized.

10 Claims, 6 Drawing Sheets

METHOD FOR FABRICATING A SEMICONDUCTOR DEVICE HAVING A DEVICE ISOLATION INSULATING FILM

BACKGROUND OF THE INVENTION

The present invention relates to a method for fabricating a semiconductor device having a device isolation insulating film, and more specifically to a method for fabricating a semiconductor device having a device isolation insulating film having an elevated device reliability, in particular, an elevated device isolation characteristics, by covering each device formation area with an oxidation-resistant film such as a nitride film just until a gate oxidation when different gate oxide films are formed on the same chip.

In general, in a MOS semiconductor device having insulated-gate field effect transistors (MOS transistors) formed on a semiconductor device chip, when a high-breakdown-voltage device-component having a high reliable breakdown voltage and a low-breakdown-voltage device-component needing a high speed operation for a high speed information processing are incorporated in a single semiconductor device chip, the high-breakdown-voltage device-component is required to have a thick gate oxide film and a thick field oxide film. On the other hand, the low-breakdown-voltage device-component is required to have a thin gate oxide film and a thin field oxide film which meet with a microminiaturization and a high speed operation of the semiconductor device.

In the prior art, as a method for forming field oxide films having different film thicknesses and gate oxide films having different film thicknesses on the same substrate in order to fabricate this type of semiconductor device, there was proposed to form a plurality of different gate oxide films by separately forming required oxide films by repetition of a gate oxidation and a wet etching (See Japanese Patent Application Pre-examination Publication No. JP-A-09-036243). Referring to FIGS. 1A to 1E, there are shown diagrammatic sectional views illustrating a process of this prior art method for forming two kinds of gate oxide film.

Figure 1A:
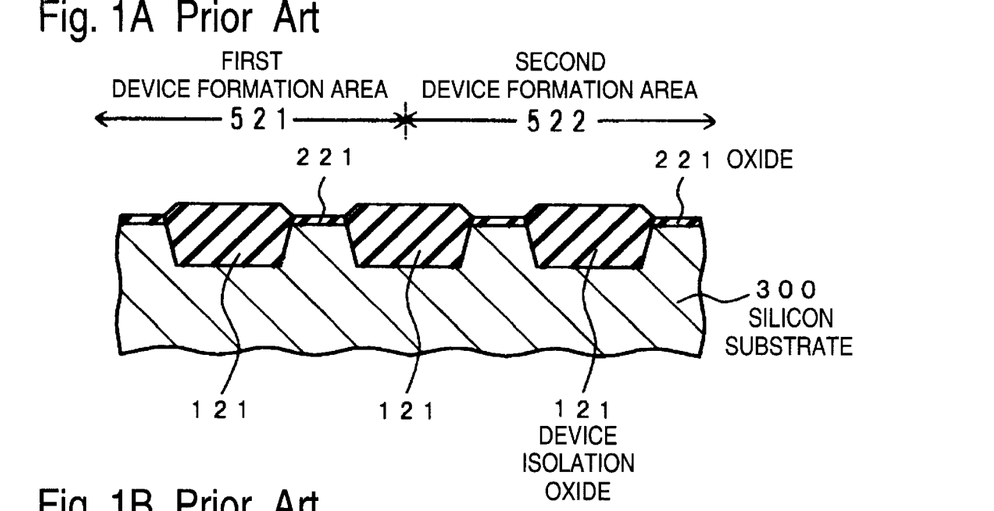
FIGS. 1A to 1E are diagrammatic sectional views illustrating the process of the prior art method for forming two kinds of gate oxide film.

FIG. 1A illustrates a condition in which a device isolation oxide film 121 for electrically isolating between device-components is formed on a principal surface of a silicon substrate 300 and a thin oxide film 221 is formed on the surface of the silicon substrate 300 to protect the substrate in an ion implantation. Therefore, the principal surface of the silicon substrate 300 is divided into a plurality of active regions confined by the device isolation oxide film 121. As shown in FIG. 1A, the silicon substrate 300 has a first device formation area 521 needing a first gate oxide film having a large film thickness, as a high breakdown voltage circuit exemplified by a write circuit in an electrically writable read-only-memory (erasable PROM), and a second device formation area 522 needing a second gate oxide film having a small film thickness for a low breakdown voltage since a high breakdown voltage is not needed. The device isolation oxide film 121 can be formed by a LOCOS (local oxidation of silicon) process, or alternatively by a trench isolation forming a trench in a region in which the device isolation oxide film 121 is to be formed, and filling up the trench with an insulating material such as a silicon oxide.

Figure 1B:
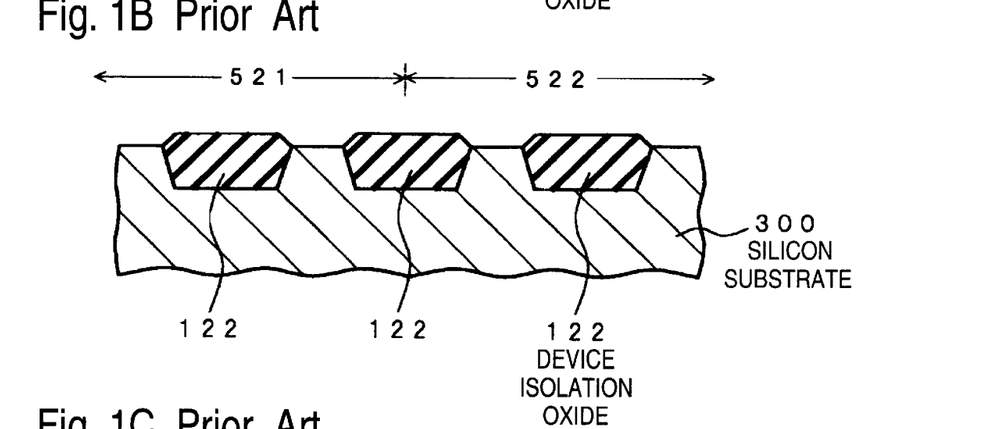

Then, as shown in FIG. 1B, the thin oxide film 221 is removed from the surface of the silicon substrate 300 by a first wet etching. Here, the device isolation oxide film 121 is thinned or diminished because of this first wet etching, and becomes a device isolation oxide film 122 which is thinner than the device isolation oxide film 121.

Figure 1C:
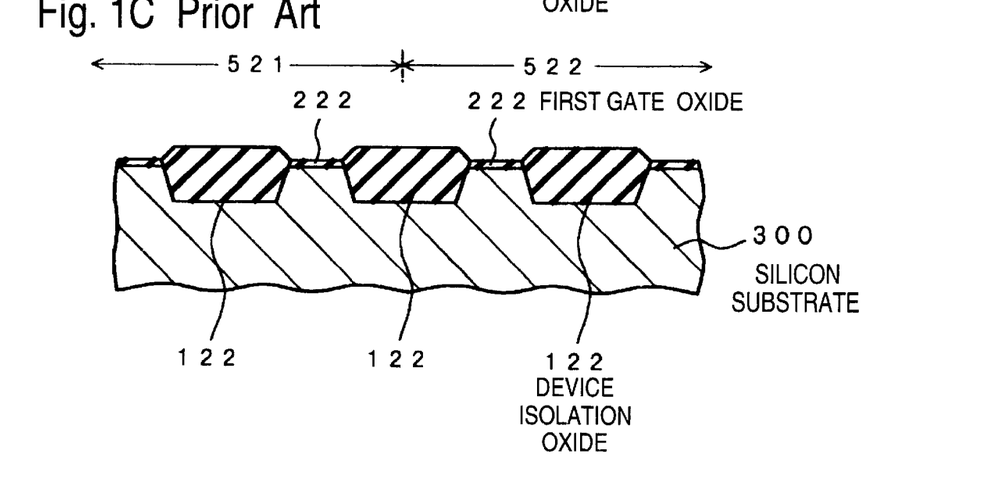

Thereafter, as shown in FIG. 1C, a first gate oxide 222 is formed on the surface of the silicon substrate 300 by oxidation, so that an oxide film is formed on an exposed surface of the silicon substrate 300 in each active region surrounded by the device isolation oxide film 122.

Figure 1D:
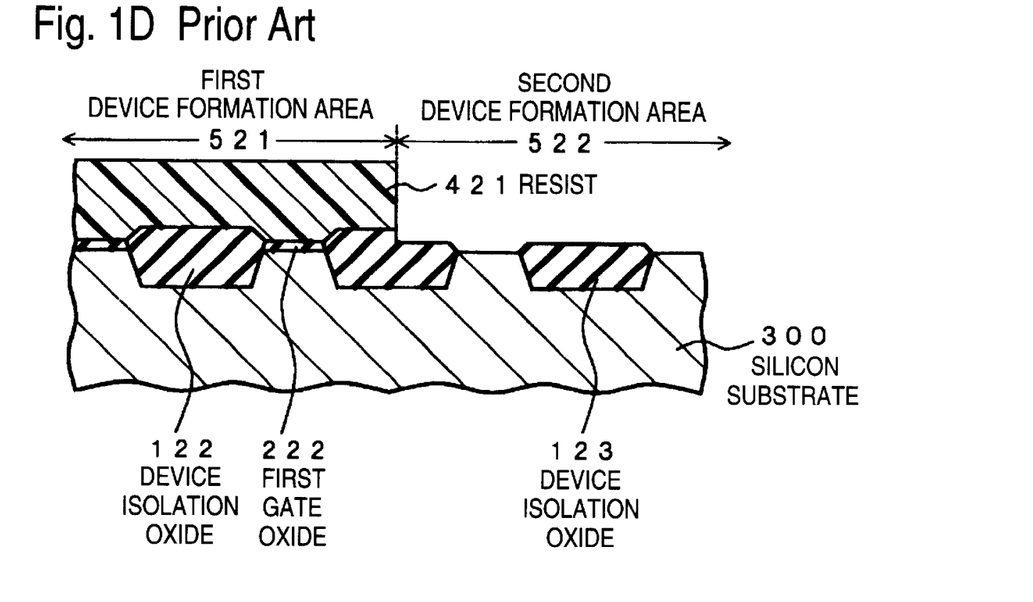

Next, gate oxide films required in the device formation areas 521 and 522, respectively, are formed separately from each other. First, as shown in FIG. 1D, a resist 421 is deposited and patterned to expose the second device formation area 522 in which a thin gate oxide film is to be formed in the active region, and the first gate oxide film 222 is removed from the surface of the substrate 300 in the second device formation area 522 by a second wet etching using the resist 421 as a mask. In this second wet etching, the device isolation oxide film 122 is further thinned or diminished to become a device isolation oxide film 123 which is thinner than the device isolation oxide film 122.

Figure 1E:
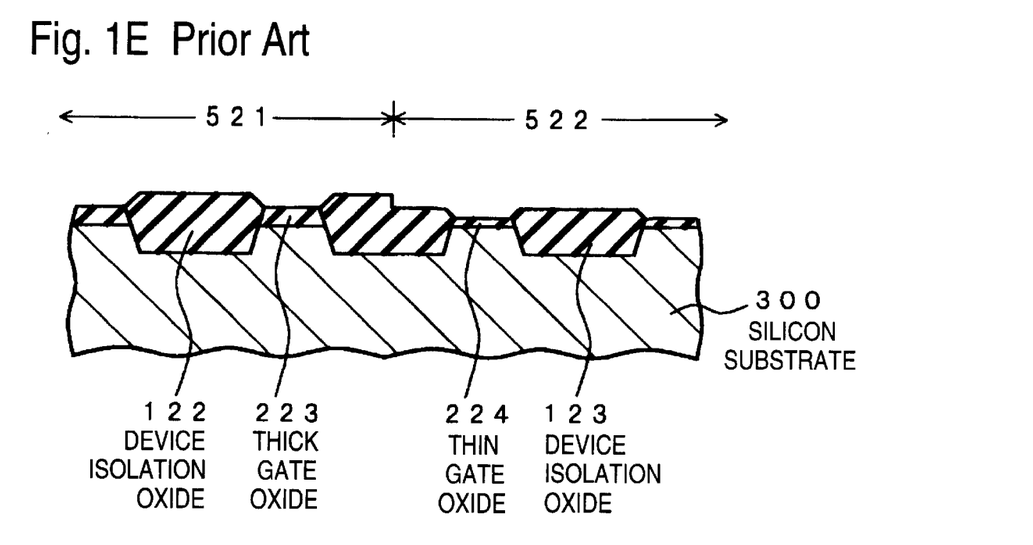

Thereafter, as shown in FIG. 1E, the resist 421 is removed, and a second gate oxide film is formed by oxidation. In this process, the second gate oxide film formed on the silicon substrate exposed in the active region within the second device formation area 522 constitutes a thin gate oxide film 224, and an oxide film formed by an additional oxidation carried out on the first gate oxide film 222 remaining on the active region within the first device formation area 521, constitutes a thick gate oxide film 223.

With the above mentioned process, the thick gate oxide film 223 and the thin gate oxide film 224 which are required in the device formation areas 521 and 522, respectively, are formed in the device formation areas 521 and 522, respectively.

In the above mentioned process for forming the gate oxide films having different film thicknesses by repeating the etching and the gate oxidation in a so called multi-oxide process for the purpose of fabricating a single semiconductor device having different gate oxide film thicknesses on a semiconductor device chip, the device isolation oxide film 121 in the second device formation area 522 is subjected to two wet etchings, one of which is carried out for removing the thin oxide film 221 as shown in FIG. 1B, and the other of which is carried out for removing the first gate oxide film 222, with the result that the device isolation oxide film 121 is thinned to the device isolation oxide film 122 and then further thinned to the device isolation oxide film 123.

The above mentioned example has two different kinds of gate oxide film, but it could be easily understood to persons skilled in the art that, if the number of the kinds of gate oxide film is increased to three, or four, or more, the number of etchings correspondingly increases, and in a device formation area in which a gate oxide film is formed after a last wet etching, the device isolation oxide film is exposed to a corresponding number of wet etchings.

However, because of a frequent repetition of the oxidation and the wet etching, the following problems have been encountered.

A first problem is that a device isolation leak occurs because implanted ions (particularly, boron) penetrates through a thinned device isolation oxide film and because an inversion layer is created by an interconnection passing directly above the device isolation oxide film. In order to prevent this device isolation leak, it can be considered to increase an initial oxidation amount for the device isolation oxide film in a recess LOCOS, or alternatively to realize the device isolation oxide film by a shallow trench isolation. However, the former is a hindrance to microminiaturization because a diffused layer is destroyed by a bird's beak. The latter aggravates the problem of a step difference which will be described next.

A second problem is that because the thickness of the device isolation oxide film is reduced from an initial oxidized condition by repeated wet etchings, a non-negligible step difference occurs at a boundary between a diffused layer and the device isolation oxide film, with the result that when a gate polysilicon is etched, a polysilicon adversely remains, which causes a short-circuiting.

A third problem is that because of the repetition of the substrate surface oxidation and the wet etching, the impurity concentration in the substrate surface is disturbed, with the result that an electrical characteristics (particularly, a threshold value of a transistor) becomes unstable.

A fourth problem is that because of the repetition of the substrate surface oxidation and the wet etching, the roughness of the substrate surface is increased with the result that an electrical characteristics is deteriorated.

The above mentioned various disadvantages are attributable to formation of oxide films unnecessary for the device-components. If the formed oxide film is unnecessary, it is necessary to remove the oxide film before the gate oxidation, so that the substrate surface is exposed. At this time, it is necessary to remove the thickness corresponding to the oxide film to be removed plus an over-etching. In particular, in a thermal oxidation such as the gate oxidation, the thickness of the thick oxide film such as the device isolation oxide film is hardly increased by the oxidation of a degree sufficient to form the gate oxide film on the substrate. As a result, the device isolation oxide film is thinned by the thickness corresponding to the thickness removed by etching the oxide film formed on the substrate.

BRIEF SUMMARY OF THE INVENTION

Accordingly, it is an object of the present invention to provide a method for fabricating a semiconductor device having a device isolation insulating film, which has overcome the above mentioned problems of the prior art.

Another object of the present invention is to provide a method for fabricating a semiconductor device having gate oxide films of different film thicknesses and a device isolation insulating film having an elevated device isolation characteristics.

The above and other objects of the present invention are achieved in accordance with the present invention by covering a substrate surface in each device formation area with a thin oxide film or an oxidation-resistant film such as a nitride film just until a respective gate oxidation in the process of forming different gate oxide films on a single semiconductor device chip, so that it is possible to prevent an unnecessary oxide film from being formed on the substrate, with the result that it is possible to reduce the amount of oxide film etchings carried out before the gate oxidation.

According to a first aspect of the present invention, there is provided a method fabricating a semiconductor device having a device isolation insulating film, the method comprising the steps of preparing a semiconductor substrate having a principal surface which is divided into a plurality of active regions confined by a device isolation insulating film and covered with an oxide film, the principal surface of the semiconductor substrate having at least first and second device formation areas each of which includes at least one active region, forming an oxidation-resistant film on the whole of the principal surface of the semiconductor substrate, selectively etch-removing the oxidation-resistant film and the oxide film using as a mask a first resist film formed on the semiconductor substrate to expose the first device formation area, forming a first gate oxide film on the semiconductor substrate, selectively etch-removing the oxidation-resistant film and the oxide film using as a mask a second resist film formed on the semiconductor substrate to expose the second device formation area, and forming a second gate oxide film on the semiconductor substrate. The oxidation-resistant film can be formed of a nitride film.

With the above mentioned arrangement, first, the oxidation-resistant film is formed on the oxide film formed on the principal surface of the semiconductor substrate in each active region, and the oxidation-resistant film thus formed is used as a protection film in each device formation area until in the same device formation area the oxidation-resistant film and the oxide film are removed and a gate oxide film is formed on the principal surface of the semiconductor substrate. Therefore, an unnecessary oxide film is in no way formed on the principal surface of the semiconductor substrate. In other words, when the first gate oxide film is formed on the principal surface of the semiconductor substrate in the first device formation area, since the principal surface of the semiconductor substrate in the second device formation area is covered with the oxidation-resistant film, an unnecessary first gate oxide film is not formed on the principal surface of the semiconductor substrate in the second device formation area. Therefore, a step of removing the first gate oxide film in the second device formation area, resulting in a simultaneous diminishment of the device isolation insulating film within the second device formation area, is no longer necessary. As a result, a sufficient thickness of the device isolation insulating film can be ensured. Accordingly, the device isolation characteristics is elevated, and reliability of the semiconductor device is correspondingly elevated.

In addition, in the first device formation area, a gate oxide film is formed by an additional oxidation for the second gate oxide film carried out on the first gate oxide film Therefore, the gate oxide film having a thickness smaller than that of the gate oxide film formed in the first device formation area is formed in the second device formation area. Thus, gate oxide films having different film thicknesses can be formed while preventing the thinning of the device isolation insulating film in the respective device formation areas.

According to a second aspect of the present invention, there is provided a method fabricating a semiconductor device having a device isolation insulating film, the method comprising the steps of preparing a semiconductor substrate having a principal surface which is divided into a plurality of active regions confined by a device isolation insulating film and covered with an oxide film, the principal surface of the semiconductor substrate having at least first and second device formation areas each of which includes at least one active region, selectively etch-removing the oxide film using as a mask a first resist film formed on the semiconductor substrate to expose the first device formation area, forming a first gate oxide film on the semiconductor substrate, selectively etch-removing the oxide film using as a mask a second resist film formed on the semiconductor substrate to expose the second device formation area, and forming a second gate oxide film on the semiconductor substrate. The device isolation insulating film can be formed by a LOCOS process, and can be embedded in a trench formed in the principal surface of the semiconductor device.

With the above arrangement, the oxide film is used as a protection film in each device formation area until in the same device formation area the oxide film is removed and a gate oxide film is formed on the principal surface of the semiconductor substrate. Therefore, when the first gate oxide film is formed on the principal surface of the semiconductor substrate in the first device formation area, since the principal surface of the semiconductor substrate in the second device formation area is covered with the already existing oxide film, the growth of the first gate oxide film in the second device formation area is suppressed by the already existing oxide film. Furthermore, when the second gate oxide film is formed, a gate oxide film is formed in the first device formation area by an additional oxidation for the second gate oxide film carried out on the first gate oxide film in the first device formation area. Therefore, the gate oxide film having a thickness smaller than that of the gate oxide film formed in the first device formation area is formed in the second device formation area. Thus, gate oxide films having different film thicknesses can be formed.

In addition, the etching amount required for removing the oxide film formed on the principal surface of the semiconductor substrate in the second device formation area becomes small because the growth of the first gate oxide film in the second device formation area is suppressed as mentioned above. As a result, it is possible to prevent the thinning of the device isolation insulating film. Accordingly, the device isolation characteristics is elevated, and reliability of the semiconductor device is correspondingly elevated.

The above and other objects, features and advantages of the present invention will be apparent from the following description of preferred embodiments of the invention with reference to the accompanying drawings.

DETAILED DESCRIPTION OF THE INVENTION

Now, the method in accordance with the present invention for fabricating a semiconductor device having a device isolation insulating film will be described in detail with reference to the accompanying drawings.

FIGS. 2A to 2F are diagrammatic sectional views illustrating a first embodiment of the method in accordance with the present invention for fabricating a semiconductor device having a device isolation insulating film.

Figure 2A:
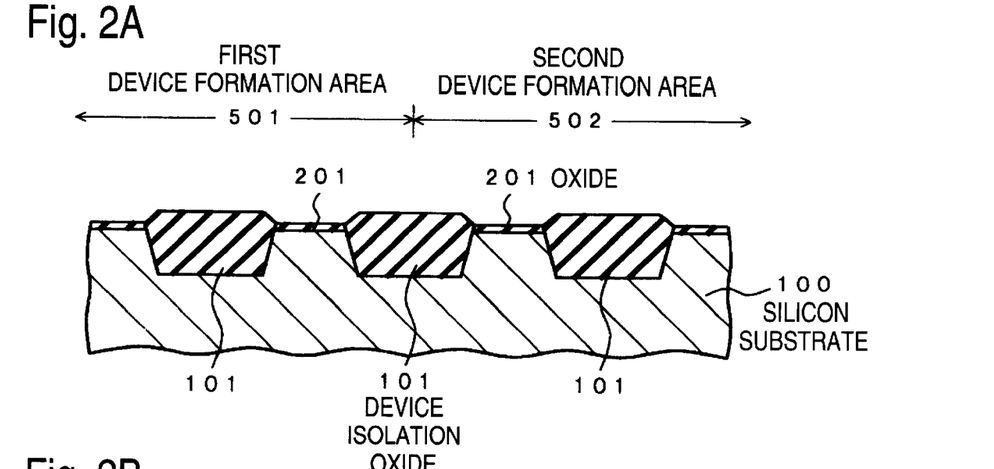
FIGS. 2A to 2F are diagrammatic sectional views illustrating the process of a first embodiment of the method in accordance with the present invention for fabricating a semiconductor device having a device isolation insulating film.

FIG. 2A illustrates a condition in which a device isolation insulating film (field oxide) 101 for electrically isolating between device-components is formed on a principal surface of a silicon substrate 100 and a thin oxide film 201 is formed on the surface of the silicon substrate 100 to protect the substrate when ions are implanted into each active region surrounded by the device isolation insulating film 101. Therefore, the principal surface of the silicon substrate 100 is divided into a plurality of active regions confined by the device isolation oxide film 101. As shown in FIG. 2A, the silicon substrate 100 has a first device formation area 501 needing a first gate oxide film having a large film thickness, as a high-breakdown-voltage circuit exemplified by a write circuit in an electrically writable read-only-memory (erasable PROM), and a second device formation area 502 needing a second gate oxide film having a small film thickness for a low breakdown voltage since a high breakdown voltage is not needed. Each of the first and second device formation areas 501 and 502 includes a number of active regions although the drawings show only two active regions in each of the first and second device formation areas 501 and 502. The device isolation insulating film 101 can be formed by a known LOCOS process, or alternatively by a trench isolation forming a trench in a region in which the device isolation insulating film 101 is to be formed, and filling up the trench with an insulating material such as a silicon oxide.

Figure 2B:
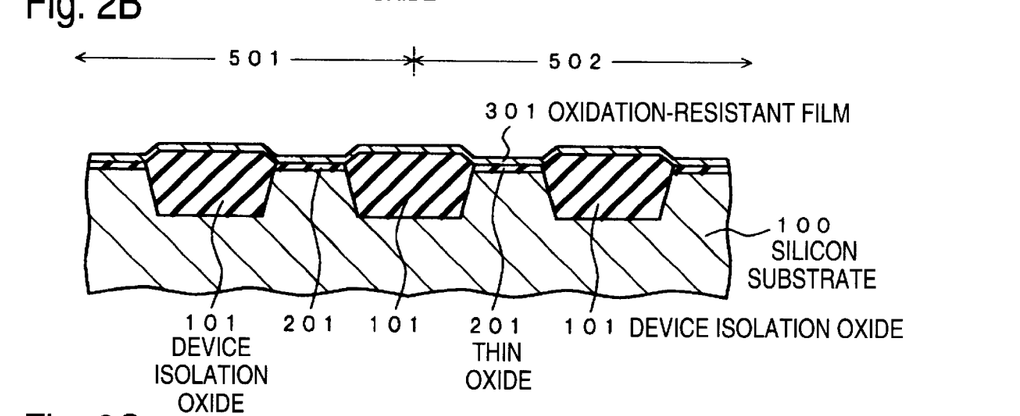

Then, as shown in FIG. 2B, an oxidation-resistant film 301 is deposited on the whole surface to cover the thin oxide film 201 and the device isolation insulating film 101 which are formed at the surface of the silicon substrate 100. This oxidation-resistant film 301 can be formed of a film of nitride such as silicon nitride.

Figure 2C:
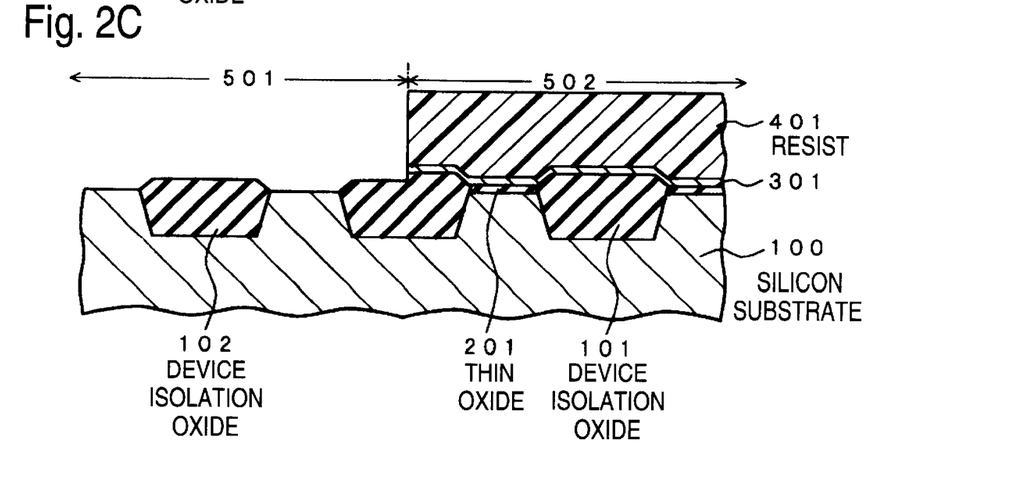

Next, gate oxide films required in the device formation areas 501 and 502, respectively, are formed. First, as shown in FIG. 2C, by a photolithography, a resist 401 is deposited and patterned to expose the first device formation area 501 in which a thick gate oxide film is to be formed. The oxidation-resistant film 301 is removed from the first device formation area 501, by using the patterned resist 401 as a mask. Furthermore, the thin oxide film 201 is removed from the surface of the substrate 100 in the second device formation area 502 by a first wet etching using the resist 401 as a mask. Only in this first wet etching, the device isolation oxide film 101 in the first device formation area 501 is diminished to become a device isolation oxide film 102.

Figure 2D:
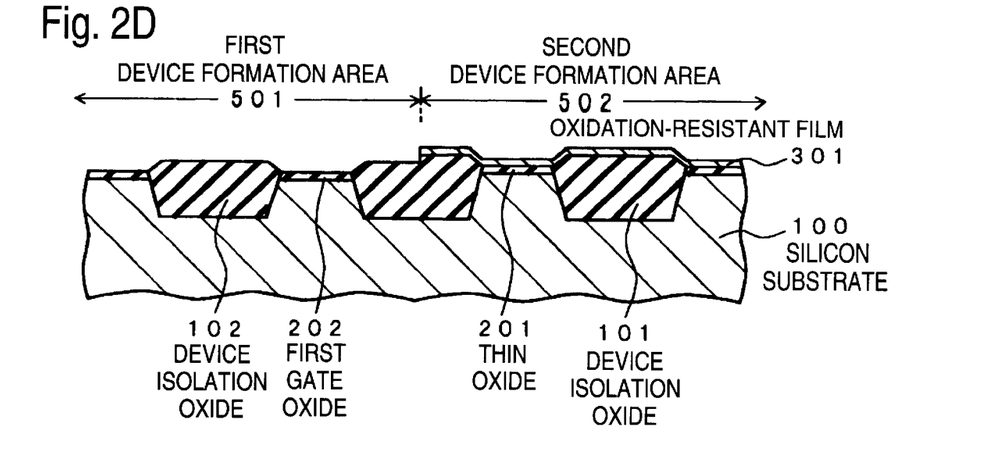

Then, as shown in FIG. 2D, the resist 401 is removed, and a gate oxide film is formed for example by oxidation. Thus, a first gate oxide film 202 is formed on the substrate surface in each active region confined by the device isolation insulating film 102 within the first device formation area 501. At this time, since the second device formation area 502 is covered with the oxidation-resistant film 301, the thickness of the thin oxide film 201 on the silicon substrate never increases.

Figure 2E:
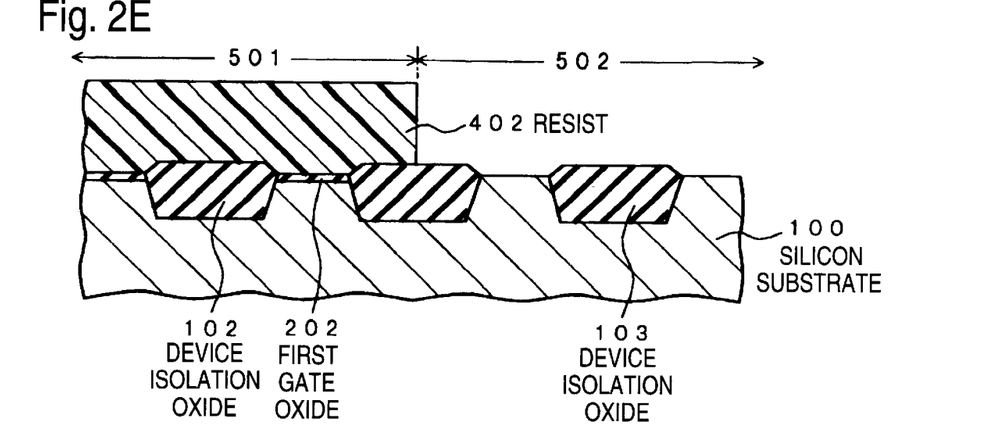

After the first gate oxide film 202 is formed, as shown in FIG. 2E, a resist 402 is deposited and patterned to protect the first gate oxide film 202 in the first device formation area 501 and to expose the substrate surface (active region) within the second device formation area 502. The oxidation-resistant film 301 is removed from the second device formation area 502, by using the patterned resist 402 as a mask. Furthermore, the thin oxide film 201 is removed from the surface of the substrate 100 in the second device formation area 502 by a second wet etching.

Since the thin oxide film 201 in the second device formation area 502 was covered with the oxidation-resistant film 301, the thickness of the thin oxide film 201 in the second device formation area 502 did not change from a time before the formation of the first gate oxide film, to a time after the formation of the first gate oxide film. Accordingly, the film thickness removed by the second wet etching for exposing the silicon substrate 100 in the second device formation area 502 is the same as that removed by the first wet etching for exposing the silicon substrate 100 in each active region within the first device formation area 501. Therefore, the device isolation oxide film 101 in the second device formation area 502 is diminished in only this second wet etching step, to become a device isolation oxide film 103. However, the diminished amount from the device isolation oxide film 101 to the device isolation oxide film 103 in the second device formation area 502 is the same as the diminished amount from the device isolation oxide film 101 to the device isolation oxide film 102 in the first device formation area 501.

Figure 2F:
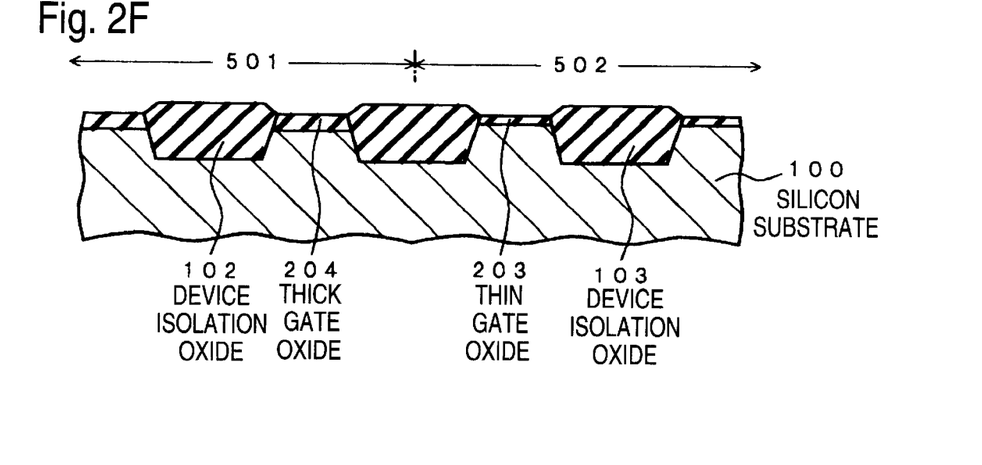

Thereafter, as shown in FIG. 2F, the resist 402 is removed, and a second gate oxide film is formed by oxidation. In this process, the second gate oxide film formed on the silicon substrate 100 exposed in each active region confined by the device isolation insulating film 103 within the second device formation area 502 constitutes a thin gate oxide film 203 for a low breakdown voltage. The first gate oxide film 202 remaining in each active region confined by the device isolation insulating film 102 within the first device formation area 501 is further oxidized by the oxidation for formation of the second gate oxide film, to become a thick gate oxide film 204.

Thus, the thick gate oxide film 204 and the thin gate oxide film 203 which are required in the device formation areas 501 and 502, respectively, are formed in the device formation areas 501 and 502, respectively.

With the above mentioned process, in the silicon substrate 100 having a plurality of active regions confined by the device isolation insulating film 101 and covered with the thin oxide film 201 formed thereon, the formation of the oxidation-resistant film 301, the two times of etching and the two times of gate oxidation are carried out, with the result that the diminished amount of the device isolation oxide film 101 in the device formation areas 501 and 502 corresponds to only one time of etching for removing the thin oxide film 201 and the oxidation-resistant film 301. This means that, if the oxidation-resistant film 301 can endure the oxidation, the etching amount is at a constant irrespectively of what thickness the first and second gate oxide films have. For example, assuming that the thin oxide film 201 has a film thickness of 20 nm, and the overetching is 80%, the diminished amount of the device isolation oxide film 101 in both the device formation areas 501 and 502 becomes 36 nm In FIG. 2F, the device isolation oxide films in the device formation areas 501 and 502 are shown by the device isolation oxide films 102 and 103, respectively, however, the device isolation oxide films 102 and 103 have the same film thickness, if a variation in a device fabricating process is ignored.

In this embodiment, two different kinds of gate oxide film are formed. However, it could be easily understood to persons skilled in the art that, even if the number of the kinds of gate oxide film is increased to three, or four, or more, the number of etchings carried out within each device formation area can be decreased to only one, if a process of exposing an active region in a device formation area by an etching and then forming a gate oxide film is repeated in the order from the device formation area needing a gate oxide film of the largest film thickness. Accordingly, since each of device formation areas needing different thicknesses of gate oxide film is covered with the oxidation-resistant film until a first gate oxide film formation becomes necessary in each device formation area, the substrate is in no way exposed to an unnecessary oxidation. In other words, the etch-removed amount of the device isolation insulating film is only the amount required for etch-removing the thin oxide film firstly formed to protect the substrate and the oxidation-resistant film formed thereon.

As seen from the above, according to the method in accordance with the present invention for fabricating the semiconductor device having the device isolation insulating film, when a plurality of gate oxide films having different film thicknesses are formed in a single semiconductor device chip, it is possible to avoid the thinning of the device isolation insulating film caused by forming different oxide films separately from one another. As a result, since the device isolation leak can be prevented, so that the semiconductor device can have an elevated reliability.

It is also possible to reduce the step difference occurring at a boundary between a diffused layer and the device isolation insulating film, which was caused by the reduction of the thickness of the device isolation insulating film.

Furthermore, it is possible to stably control the impurity concentration in the substrate surface since the total amount of oxidation carried out over the surface of diffused layers becomes small.

It is further possible to reduce the roughness of the substrate surface since the amount etch-removed at the surface of all diffused layers becomes small.

Now, a second embodiment of the method in accordance with the present invention for fabricating a semiconductor device having a device isolation insulating film will be described with reference to FIGS. 3A to 3E which are diagrammatic sectional views illustrating the process of the second embodiment of the method for fabricating the semiconductor device having the device isolation insulating film.

Figure 3A:
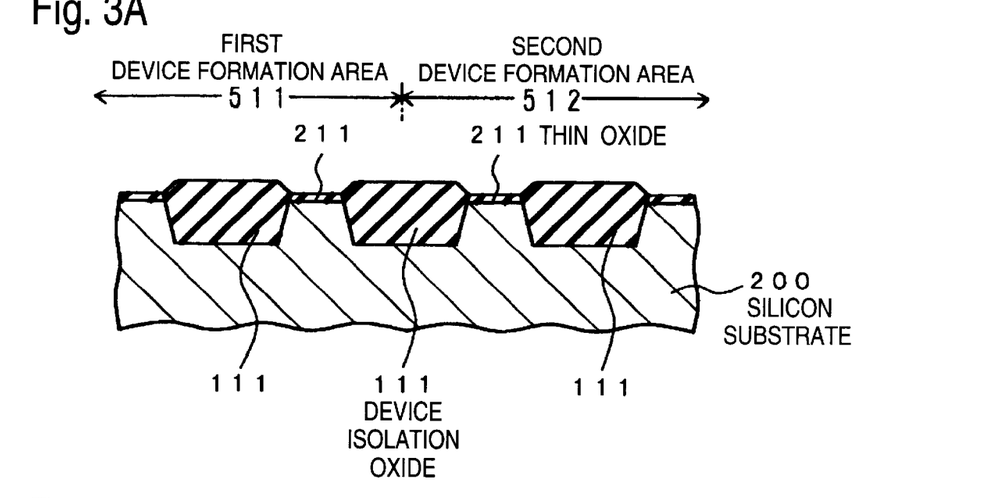
FIGS. 3A to 3E are diagrammatic sectional views illustrating the process of a second embodiment of the method in accordance with the present invention for fabricating a semiconductor device having a device isolation insulating film.

FIG. 3A illustrates a condition in which a device isolation oxide film 111 for electrically isolating between device-components is formed on a principal surface of a silicon substrate 200 and a thin oxide film 211 is formed on the surface of the silicon substrate 200 in each active region confined by the device isolation oxide film 111, to protect the substrate in an ion implantation. As shown in FIG. 3A, the silicon substrate 200 has a first device formation area 511 needing a first gate oxide film having a large film thickness for a high-breakdown-voltage device-component, and a second device formation area 512 needing a second gate oxide film having a small film thickness for a low-breakdown-voltage device-component.

Figure 3B:
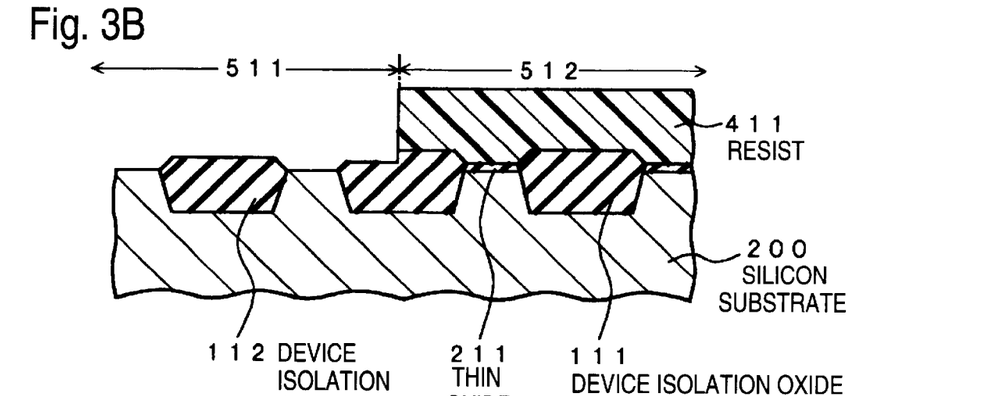

Next, gate oxide films required in the device formation areas 511 and 512, respectively, are formed. First, as shown in FIG. 3B, a resist 411 is deposited and patterned to expose the first device formation area 511 in which a thick gate oxide film is to be formed, and the thin oxide film 211 is removed from the surface of the substrate 200 in the first device formation area 511 by a first etching using the resist 411 as a mask. The device isolation oxide film 111 in the first device formation area 511 is diminished in only this first etching step, to become a device isolation oxide film 112.

Figure 3C:
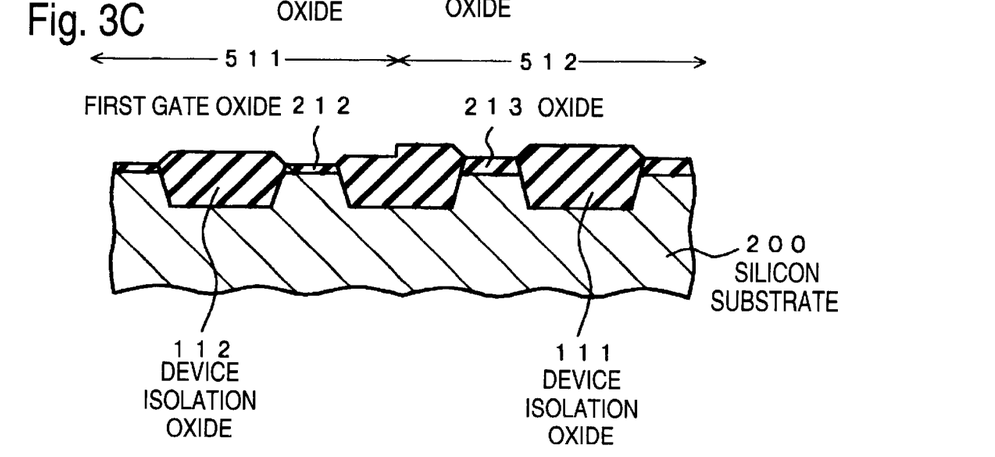

Then, as shown in FIG. 3C, the resist 411 is removed, and a first gate oxide film is formed for example by oxidation. Thus, a first gate oxide film 212 is formed on the substrate surface in each active region confined by the device isolation oxide film 112 within the first device formation area 511 At this time, within the second device formation area 512, the thin oxide film 211 formed on the substrate surface in the active region confined by the device isolation oxide film 111 is subjected to an additional oxidation, so that the thin oxide film 211 becomes an oxide film 213.

Figure 3D:
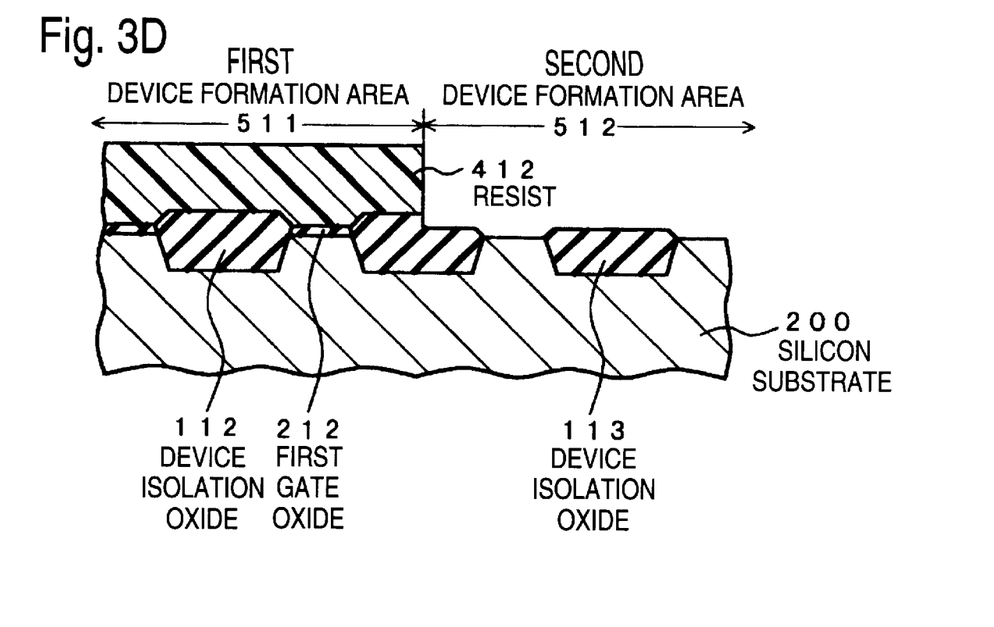

Thereafter, as shown in FIG. 3D, a resist 412 is deposited and patterned to protect the first gate oxide film 212 formed on the silicon substrate 200 in each active region confined by the device isolation oxide film 112 within the first device formation area 511 and to expose the silicon substrate 200 in each active region within the second device formation area 512. And, the oxide film 213 is removed from the surface of the substrate 200 within the second device formation area 512 by a second etching using the patterned resist 412 as a mask.

The thickness increasing from the thin oxide film 211 to the oxide film 213 when the first gate oxide film 212 was formed by oxidation, is smaller than the thickness of the first gate oxide film 212 since the growth of oxide film is suppressed because of the previously formed thin oxide film 211, in comparison with the growth of the first gate oxide film 212 formed on an exposed substrate surface. The film thickness of the oxide film 213 to be removed by the second etching for exposing the silicon substrate 200 within the second device formation area 512 is smaller than the sum of the film thickness of the thin oxide film 211 and the film thickness of the first gate oxide film 212. In addition, the device isolation oxide film 111 in the second device formation area 512 is diminished in only this second etching step, to become a device isolation oxide film 113. However, the diminished amount from the device isolation oxide film 111 to the device isolation oxide film 113 within the second device formation area 512 is smaller than that in the prior art.

Figure 3E:
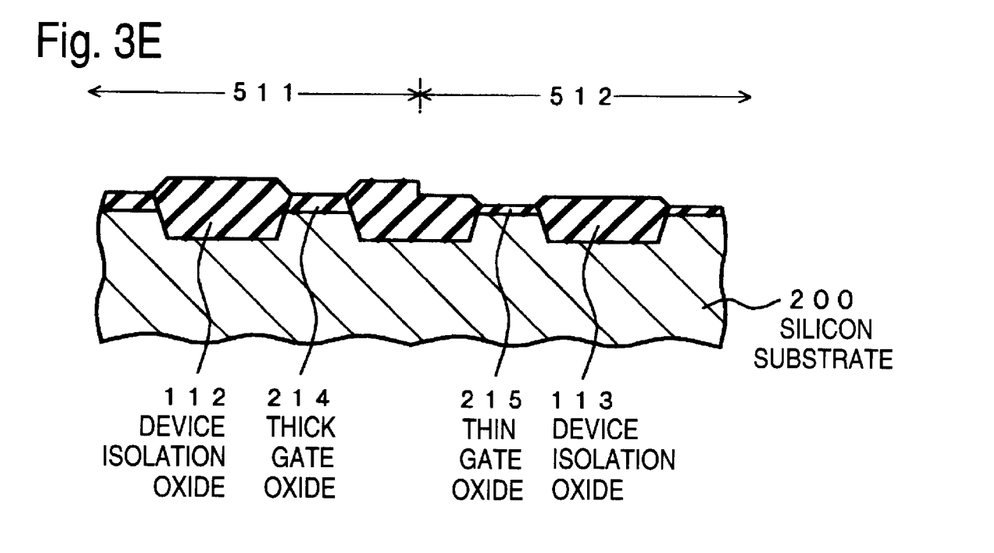

Thereafter, as shown in FIG. 3E, the resist 412 is removed, and a second gate oxide film is formed by oxidation. In this process, the second gate oxide film formed on the silicon substrate 200 exposed in each active region confined by the device isolation oxide film 113 within the second device formation area 512 constitutes a thin gate oxide film 215. The first gate oxide film 212 remaining on the silicon substrate 200 in each active region confined by the device isolation oxide film 112 within the first device formation area 511 is further oxidized by the oxidation for formation of the second gate oxide film, to become a thick gate oxide film 214.

Thus, the thick gate oxide film 214 and the thin gate oxide film 215 which are required in the device formation areas 511 and 512, respectively, are formed in the device formation areas 511 and 512, respectively.

With the above mentioned process, in the silicon substrate 200 having a plurality of active regions confined by the device isolation oxide film 111 and covered with the thin oxide film 211 formed thereon, the previously formed thin oxide film 211 is utilized as a protection film, and the two times of etching and the two times of gate oxidation are carried out, with the result that the diminished amount of the device isolation oxide film 111 in the device formation areas 511 and 512 corresponds to only one time of etching for removing the thin oxide film 211 or the oxide film 213 formed by additionally oxidizing the thin oxide film 211.

In this second embodiment, the oxidation-resistant film such as the nitride film formed in the first embodiment is not formed on the thin oxide film 211. Accordingly, within the second device formation area 512, since the gate oxide film is grown at a later step, the substrate in the second device formation area 512 is subjected to an extra oxidation. However, this extra oxidation is an additional oxidation to the already existing thin oxide film 211, and therefore, the oxidized amount of the substrate is smaller than the prior art in which the exposed substrate is oxidized. This means that the amount etch-removed for exposing the substrate before performing the gate oxidation, is small.

In addition, comparing with the first embodiment, since the second embodiment no longer needs the etching-removal of the oxidation-resistant film, the etching process becomes simpler than in the first embodiment, and the number of steps can be correspondingly reduced in comparison with the first embodiment.

For example, assume that the thick gate oxide film 214 has a film thickness of 44 nm and the thin gate oxide film 215 has a film thickness of 10 nm. In this case, it is necessary to form an oxide film having a film thickness of about 40 nm on the substrate surface as the first gate oxide film 212 shown in FIG. 3C. Since the thin oxide film 211 (20 nm) remains in the second device formation area 512, the oxide film 213 remaining in the second device formation area 512 after the first gate oxidation is carried out, is 48 nm. Accordingly, in the second device formation area 512 in which the thinning of the device isolation oxide film 111 becomes a problem, the diminished amount of the device isolation oxide film 111 by the second etching becomes 86.4 nm assuming that the overetching is 80%.

The prior art will be compared with the above mentioned embodiments, assuming that the overetching is 80%. In the prior art, as shown in FIG. 1B, the thin oxide film 221 (20 nm) is etch-removed by the first etching before the first gate oxide film is formed. At this time, accordingly, the device isolation oxide film 121 in the second device formation area 522 is reduced by 36 nm (to become the device isolation oxide film 122). Thereafter, as shown in FIG. 1C, the first gate oxide film 222 having the film thickness of 40 nm is formed on the silicon substrate 300 in each active region confined by the device isolation oxide film 122 within the second device formation area 522. Accordingly, the diminished amount of the device isolation oxide film 122 by the second etching becomes 72 nm (to become the device isolation oxide film 123). In other words, the oxidation amount of the silicon substrate 300 within the second device formation area 522 reaches 60 nm at total, and the device isolation oxide film is diminished by 108 nm in the second device formation area 522 in which the thin gate oxide film is formed.

The following table shows the diminished amount of the device isolation oxide film and the required additional steps in the prior art and the first and second embodiments of the present invention under the condition that the protection film for the ion implantation is 20 nm, gate oxide films having a film thickness of 40 nm and 10 nm, respectively, are formed, and the overetching is 80%.

|  | diminished amount of device isolation oxide film | number of patterning steps | number of added steps |
| --- | --- | --- | --- |
| Prior Art | 108.0 nm | 1 | 0 |
| First Embodiment | 36.0 nm | 2 | 2 (nitride etching) |
| Second Embodiment | 86.4 nm | 2 | 0 |

Comparing the first and second embodiments with the prior art, it would be seen that the first and second embodiments can be reduce the diminished amount of the device isolation oxide film in comparison with the prior art, so that the thinning of the device isolation oxide film is minimized.

Comparing the second embodiment in which the thin oxide film is used as the protection film for the extra oxidation, with the first embodiment in which the oxidation-resistant film such as the nitride film is formed as the protection film for the extra oxidation, the effect for protecting from the oxidation may not be satisfactory in the second embodiment, but it is no longer necessary to add the step for forming the protection film for oxidation. In addition, the etch-removing steps of the multiple film as shown in FIGS. 2C and 2E are no longer necessary in the second embodiment, so that the etching processing becomes simple.

As mentioned above, according to the method in accordance with the present invention for fabricating the semiconductor device having the device isolation insulating film, when a plurality of gate oxide films having different film thicknesses are formed in a single semiconductor device chip, since the thin oxide film or the multiple film composed of the thin oxide film and the oxidation-resistant film is used as the protection film for the substrate oxidation, it is possible to avoid formation of an unnecessary oxide film on the substrate, and it is possible to avoid the thinning of the device isolation insulating film caused by forming different oxide films separately from one another, with the result that the device isolation leak can be prevented.

It is also possible to reduce the step difference occurring at a boundary between a diffused layer and the device isolation insulating film, which was caused by the reduction of the thickness of the device isolation insulating film.

Furthermore, it is possible to stably control the impurity concentration in the substrate surface since the total amount of oxidation carried out over the surface of diffused layers becomes small.

It is further possible to reduce the roughness of the substrate surface since the amount etch-removed at the surface of all diffused layers becomes small.

The invention has thus been shown and described with reference to the specific embodiments. However, it should be noted that the present invention is in no way limited to the details of the illustrated structures but changes and modifications may be made within the scope of the appended claims.

What is claimed is:

1. A method of fabricating a semiconductor device having a device isolation insulating film, the method comprising the steps of preparing a semiconductor substrate having a principal surface which is divided into a plurality of active regions confined by a device isolation insulating film and said active regions covered with a temporary thin oxide film, said principal surface of said semiconductor substrate having at least first and second device formation areas each of which includes at least one active region, forming an oxidation-resistant film on and in contact with the whole of said principal surface of said semiconductor substrate including said thin oxide film, selectively etch-removing portions of said oxidation-resistant film and said thin oxide film using as a mask a first resist film formed on said semiconductor substrate to expose said first device formation area, forming a first gate oxide film on said semiconductor substrate, etch-removing a selected part of remaining portions or all of remaining portions of said oxidation-resistant film and said thin oxide film using as a mask a second resist film formed on said semiconductor substrate to expose said second device formation area, and forming a second gate oxide film on said semiconductor substrate.

2. A method claimed in claim 1 wherein said oxidation-resistant film is formed of a nitride film.

3. A method claimed in claim 1 wherein said device isolation insulating film is formed by a LOCOS process.

4. A method claimed in claim 1 wherein said device isolation insulating film is embedded in a trench formed in said principal surface of said semiconductor device.

5. A method claimed in claim 1 wherein said device isolation insulating film is formed of silicon oxide.

6. A method claimed in claim 5 wherein said oxidation-resistant film is formed of silicon nitride.

7. A method of fabricating a semiconductor device having a device isolation insulating film, the method comprising the steps of preparing a semiconductor substrate having a principal surface which is divided into a plurality of active regions confined by a device isolation insulating film and said active regions covered with a temporary thin oxide film, said principal surface of said semiconductor substrate having at least first and second device formation areas each of which includes at least one active region, selectively etch-removing portions of said thin oxide film using as a mask a first resist film formed on said semiconductor substrate to expose said first device formation area, forming a first gate oxide film on said semiconductor substrate, etch-removing a selected part of remaining portions or all of remaining portions of said thin oxide film using as a mask a second resist film formed on said semiconductor substrate to expose said second device formation area, and forming a second gate oxide film on said semiconductor substrate.

8. A method claimed in claim 7 wherein said device isolation insulating film is formed by a LOCOS process.

9. A method claimed in claim 7 wherein said device isolation insulating film is embedded in a trench formed in said principal surface of said semiconductor device.

10. A method claimed in claim 7 wherein said device isolation insulating film is formed of silicon oxide.

* * * * *